United States Patent
Ku et al.

(10) Patent No.: US 7,755,402 B1
(45) Date of Patent: Jul. 13, 2010

(54) CALIBRATION OF SEPARATE DELAY EFFECTS FOR MULTIPLE DATA STROBE SIGNALS

(75) Inventors: Ting-Sheng Ku, San Jose, CA (US); Ashfaq R. Shaikh, San Jose, CA (US)

(73) Assignee: nVidia, Santa Clara, CA (US)

( * ) Notice: Subject to any disclaimer, the term of this patent is extended or adjusted under 35 U.S.C. 154(b) by 0 days.

(21) Appl. No.: 11/413,294

(22) Filed: Apr. 28, 2006

(51) Int. Cl.
*H03L 7/00* (2006.01)

(52) U.S. Cl. .................. 327/153; 327/12; 327/161; 327/261

(58) Field of Classification Search .............. 327/12, 327/149, 153, 158, 161–163, 202, 261; 375/316, 375/373–376; 331/17, 25
See application file for complete search history.

(56) References Cited

U.S. PATENT DOCUMENTS

| | | | |
|---|---|---|---|
| 4,458,165 A | | 7/1984 | Jackson |
| 5,438,303 A * | | 8/1995 | Murakami et al. .......... 332/109 |
| 5,524,035 A * | | 6/1996 | Casal et al. ................... 377/47 |
| 5,692,165 A * | | 11/1997 | Jeddeloh et al. ............. 713/400 |
| 5,905,391 A | | 5/1999 | Mooney ...................... 327/161 |
| 5,948,083 A | | 9/1999 | Gervasi ......................... 710/62 |
| 6,011,977 A * | | 1/2000 | Brown et al. ................ 455/503 |
| 6,144,034 A * | | 11/2000 | Scharf et al. ................ 250/369 |
| 6,271,682 B1 * | | 8/2001 | Lindsay ........................ 326/93 |
| 6,326,813 B2 * | | 12/2001 | Lindsay ........................ 326/93 |
| 6,396,250 B1 * | | 5/2002 | Bridge ........................ 323/283 |
| 6,424,198 B1 * | | 7/2002 | Wolford ..................... 327/291 |
| 6,433,600 B2 | | 8/2002 | Ilkbahar |
| 6,496,043 B1 * | | 12/2002 | Moss et al. .................... 327/12 |
| 6,796,043 B2 | | 12/2002 | Moss et al. .................... 327/12 |
| 6,509,762 B1 * | | 1/2003 | Moss et al. .................... 327/12 |
| 6,580,301 B2 * | | 6/2003 | Moshe et al. ............... 327/256 |
| 7,120,067 B2 * | | 10/2006 | Han ....................... 365/189.05 |
| 7,157,948 B2 * | | 1/2007 | McClannahan et al. ..... 327/151 |
| 7,197,053 B1 * | | 3/2007 | Liu et al. ..................... 370/503 |
| 7,233,170 B2 * | | 6/2007 | Becker et al. ................. 326/93 |
| 7,312,667 B2 * | | 12/2007 | Mobin et al. .................. 331/45 |
| 7,362,107 B2 * | | 4/2008 | Tseng et al. ................. 324/601 |
| 2006/0245519 A1 | | 11/2006 | Cheng et al. ................ 375/316 |
| 2007/0033448 A1 * | | 2/2007 | Waschura et al. ........... 714/704 |

OTHER PUBLICATIONS

Sidiropoulos et al, "A Semidigital Dual Delay—Locked Loop", *IEEE Journal of Solid-State Circuits*, vol. 32, No. 11, Nov. 1997.

(Continued)

*Primary Examiner*—Lincoln Donovan
*Assistant Examiner*—William Hernandez
(74) *Attorney, Agent, or Firm*—Berkeley Law & Technology Group, LLP

(57) ABSTRACT

Embodiments for positioning rising and/or filling edges of data strobe signals are disclosed. One example embodiment may comprise receiving a data signal, positioning an edge of a first delayed data strobe signal associated with the data signal by a first programmable amount, and positioning an edge of a second delayed data strobe signal associated with the data signal by a second programmable amount, wherein the second delayed data strobe signal is shifted approximately one bit-time in relation to the first delayed data strobe signal.

17 Claims, 13 Drawing Sheets

OTHER PUBLICATIONS

Sidiropouos et al, "A 700-Mb/s/pin CMOS Signaling Interface Using Current Integrating Receivers", *IEEE Journal of Solid-State Circuits*, vol. 32, .No. 5, May 1997.
Office Action for U.S. Appl. No. 11/289,805 dated Dec. 31, 2007.
RCE and Response to Office Action for U.S. Appl. No. 11/289,805 dated Oct. 9, 2007.
Advisory Action for U.S. Appl. No. 11/289,805 dated Sep. 24, 2007.
Response to Office Action for U.S. Appl. No. 11/289,805 dated Sep. 6, 2007.
Office Action for U.S. Appl. No. 11/289,805 dated Jun. 7, 2007.
Response to Office Action for U.S. Appl. No. 11/289,805 dated Apr. 24, 2007.
Office Action for U.S. Appl. No. 11/289,805 dated Jan. 24, 2007.
Response to Office Action for U.S. Appl. No. 11/289,805 dated Mar. 26, 2008.
RCE and Amendment for related U.S. Appl. No. 11/289,805 dated Oct. 30, 2008.
Advisory Action for related U.S. Appl. No. 11/289,805 dated Oct. 10, 2008.
Response to Final Office Action for related U.S. Appl. No. 11/289,805 dated Oct. 1, 2008.
Final Office Action for related U.S. Appl. No. 11/289,805 dated Aug. 6, 2008.
Final Office Action mailed Aug. 6, 2008 in related U.S. Appl. No. 11/289,805, 16 pages.
Amendment After Final mailed Oct. 1, 2008 in related U.S. Appl. No. 11/289,805, 12 pages.
Advisory Action mailed Oct. 10, 2008 in related U.S. Appl. No. 11/289,805, 3 pages.
RCE and Amendment filed Oct. 30, 2008 in related U.S. Appl. No. 11/289,805, 14 pages.
Office Action mailed Dec. 24, 2008 in related U.S. Appl. No. 11/289,805, 15 pages.
Response filed Feb. 19, 2009 in related U.S. Appl. No. 11/289,805, 11 pages.
Final Office action mailed Aug. 24, 2009 in related U.S. Appl. No. 11/289,805, 11 pages.

* cited by examiner

CALIBRATION OF SEPARATE DELAY EFFECTS FOR MULTIPLE DATA STROBE SIGNALS

BACKGROUND

This disclosure is related to positioning of edges of one or more data strobe signals within a computing platform.

As interfaces between components in computing platforms and/or between units within integrated circuits increase in transmission speed and/or bus width, noise and signal integrity issues increase in importance. For some computing platforms, data transfer interfaces may include data that is latched at a receiving device or unit in response to rising and/or falling edges of a strobe signal generated by a transmitting device or unit. One example of such an interface is a double data rate (DDR) memory interface. As data rates increase, the issue of timing skew between the strobe signal and one or more data lines becomes increasingly important. Variations in the duty cycle of the strobe signal may also increase in importance as the data rates of the interfaces increase.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

Figure 1:
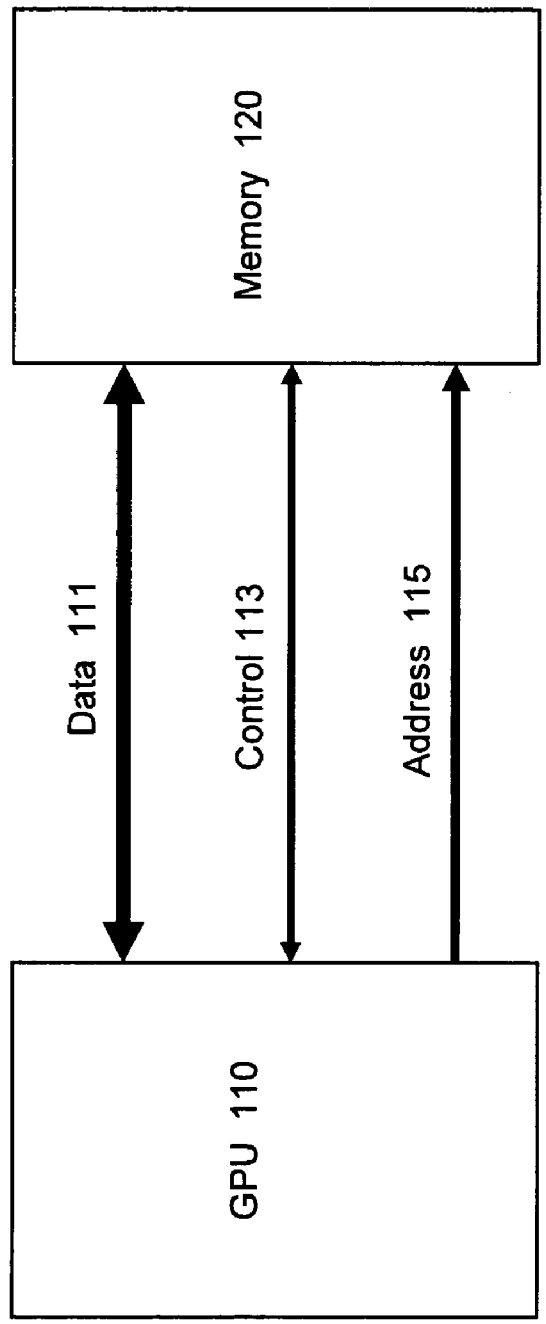
FIG. 1 is a block diagram of an example embodiment of a graphics processing unit coupled to a memory device via a data transfer interface.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

"Logic" as referred to herein relates to structure for performing one or more logical operations. For example, logic may comprise circuitry which provides one or more output signals based at least in part on one or more input signals. Such circuitry may comprise a finite state machine which receives a digital input signal and provides a digital output signal, or circuitry which provides one or more analog output signals in response to one or more analog input signals. Such circuitry may be provided, for example, in an application specific integrated circuit (ASIC) and/or a field programmable gate array (FPGA). Also, logic may comprise machine-readable instructions stored in a storage medium in combination with a processor or other processing circuitry to execute such machine-readable instructions. However, these are merely examples of structures which may provide logic and claimed subject matter is not limited in these respects.

Unless specifically stated otherwise, as apparent from the following discussion, it is appreciated that throughout this specification discussions utilizing terms such as "processing," "computing," "calculating," "selecting," "forming," "enabling," "inhibiting," "identifying," "initiating," "querying," "obtaining," "hosting," "maintaining;" "representing," "modifying," "receiving," "transmitting," "storing," "determining" and/or the like refer to the actions and/or processes that may be performed by a computing platform, such as a computer or a similar electronic computing device, that manipulates and/or transforms data represented as physical, electronic and/or magnetic quantities and/or other physical quantities within the computing platform's processors, memories, registers, and/or other information storage, transmission, reception and/or display devices. Accordingly, a computing platform refers to a system or a device that includes the ability to process and/or store data in the form of signals. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform.

As used herein, the term "data strobe signal" is meant to include any signal, including but not limited to periodic signals, used to control the timing of data latching operations in any device, component, unit, and/or circuit in an electronic device such as a computing platform. Further, the term "data strobe signal" is meant to include clock signals. For some embodiments, data strobe signals may be generated within a device based at least in part on a received clock signal or data strobe. For example, data strobe signals may be generated by using a phase locked loop (PLL) circuit to divide a clock signal and/or to generate phase-shifted copies of a data strobe signal.

The term "bit-time" as used herein may refer to the approximate duration of one data pulse (one bit) on a data signal or data transfer interconnect. For example, a data transfer interconnect with a bit rate of 100 Mbps per data line may have a bit-time of 10 ns. That is, for this example, one bit of data may be transferred across one line of the data transfer interconnect every 10 ns. This is merely an example of a bit-time, and the scope of the claimed subject matter is not limited in this respect.

Also, as used herein, the term "edge" in connection with a signal is meant to denote a transition in the signal from a first logical voltage level to a second logical voltage level. A change in state from a logically low voltage level to a logically high voltage level may be referred to as a "rising edge." A change in state from a logically high voltage level to a logically low voltage level may be referred to as a "falling edge."

Further, as used herein, the terms "position" and/or "positioning" and/or "positioned" in reference to a data strobe signal are meant to include any technique, process, device, and/or method for adjusting the timing of rising and/or falling edges of a strobe signal in relation to one or more data lines.

FIG. 1 is a block diagram of an example embodiment of a graphics processing unit (GPU) 110 coupled to a memory device 120 via a data transfer interface. For this example embodiment, the data transfer interface may comprise one or more data lines 111, one or more control lines 113, and one or more address lines 115, although the scope of the claimed subject matter is not limited in this respect. GPU 110 and memory device 120 are merely examples of component and/or device and/or unit types that may be coupled via data transfer interfaces, and the scope of the claimed subject matter is not limited in this respect.

Figure 2:
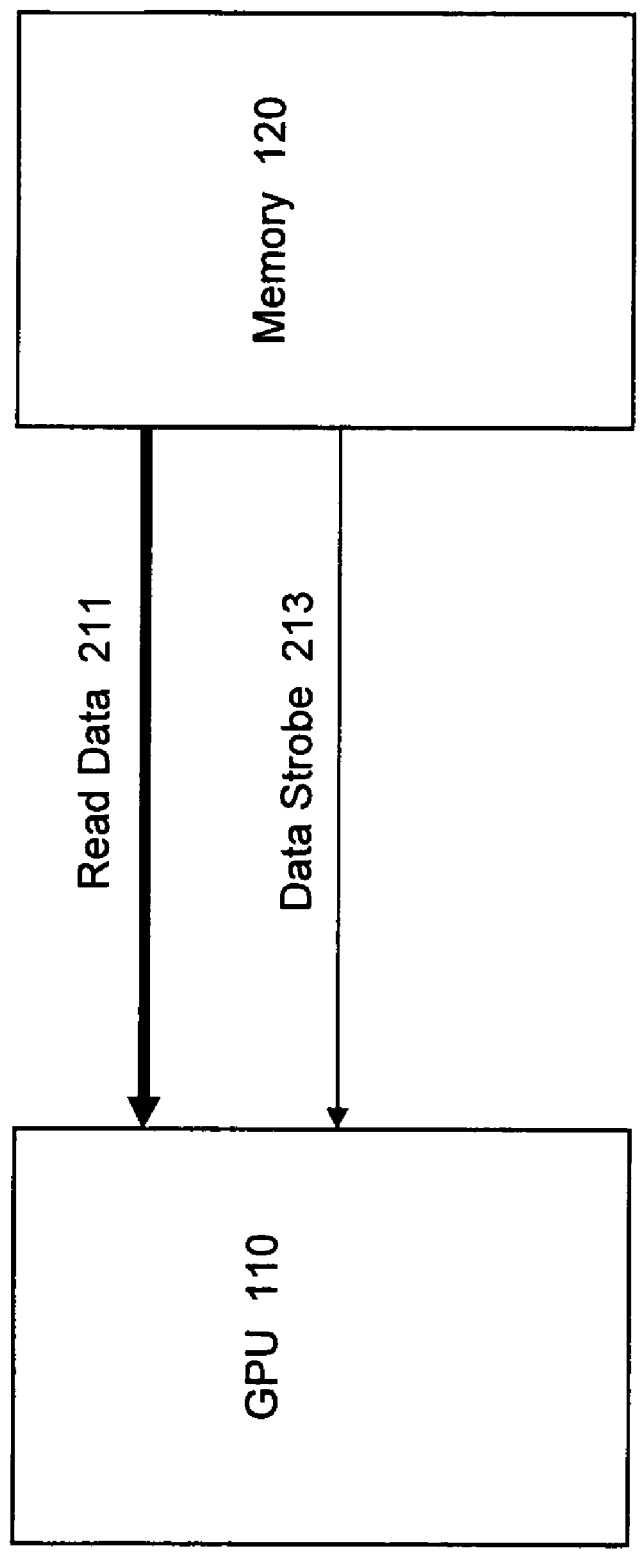
FIG. 2 is a block diagram of an example embodiment of a graphics processing unit adapted to receive read data and a data strobe signal from a memory device.

FIG. 2 depicts memory device 120 transmitting read data over data lines 211 to GPU 110. For this example embodiment, read data 211 may be transferred over a plurality of parallel data lines. Also for this example embodiment, read data 211 may be transferred in a source-synchronous mode. For this example embodiment, GPU 110 latches data on the data lines 211 in response to transitions of a data strobe signal 213. Data strobe 213 may be generated by memory device 120 for this example embodiment. GPU 110 is merely an example of a receiving device, component, and/or unit, and the scope of the claimed subject matter is not limited in this respect. Also, memory device 120 is merely an example of a transmitting device, component, and/or unit, and the scope of the claimed subject matter is not limited in this respect.

Figure 3:
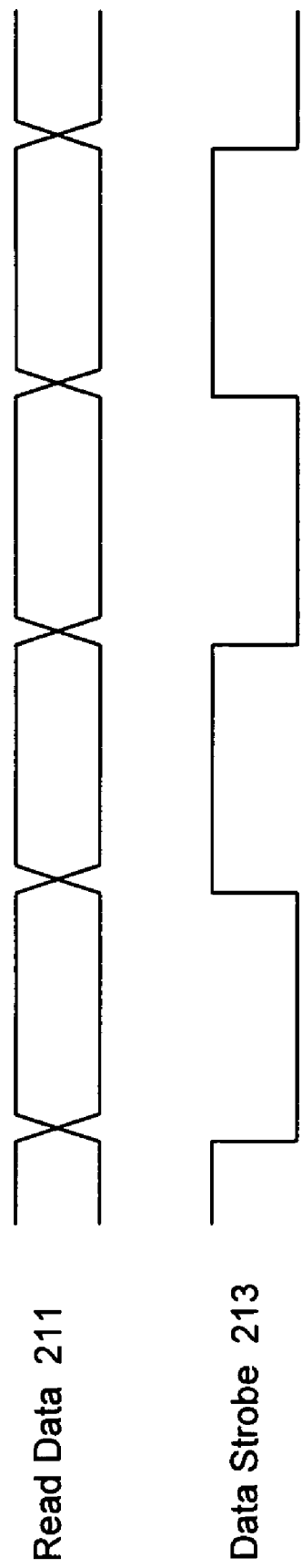
FIG. 3 is a timing diagram depicting an example read data signal and an example data strobe signal.

FIG. 3 is a timing diagram depicting an example timing relationship between one or more read data lines 211 and data strobe signal 213. For this example, memory device 120 may generate transitions for the read data signals and the data strobe approximately synchronously. As used herein, the term "transition" in connection with a signal is meant to denote a change in state from a first logical voltage level to a second logical voltage level. As can be seen in FIG. 3, a new read data value may be driven onto data lines 211 upon each transition of data strobe signal 213. However, this is merely an example relationship between one or more data lines and a strobe signal, and the scope of the claimed subject matter is not limited in this respect.

As previously mentioned, as data transfer rates increase on data transfer interfaces, issues such as noise and timing skew between various signals may play increasingly important roles in limiting potential performance of the data transfer interfaces. For a source synchronous interface such as the example interface described above in connection with FIGS. 1-3, one issue that may limit potential performance is timing skew between a data strobe and associated data lines. One example of timing skew may involve transitions on data lines being generated by a transmitting device at approximately the same time as a transition is generated on a strobe signal by the transmitting device, but the data strobe transition is received at a slightly different time than the transitions on the data line by a receiving device. This time difference may be due to any of a number of factors, including different electrical trace lengths for the various signals on printed circuit boards, variations of electrical characteristics of electrical connections coupling the transmitting device and the receiving device, variations in drive strength at the transmitting device for the various signals, etc. Because a receiving device for a source synchronous interface latches data on the data lines in response to a transition of the strobe signal, any timing variations of the strobe signal with respect to the data signals will effect when the receiving device samples the data. Ideally, a receiving device would sample the data lines at a point in time that provides optimal set-up and hold times. Timing skew between the data lines and the strobe signal may result in the receiving device not sampling the data lines at an approximately optimal point in time.

For one or more example embodiments described herein, a receiving device may latch data in response to both rising and falling edges of a strobe signal. For one embodiment, the interface between GPU 110 and memory device 120 may comprise a Double Data Rate (DDR) memory interface. For such an embodiment, for every period of a strobe signal, two data transitions occur. For DDR and other interfaces where data is latched in response to both rising and falling edges of a strobe signal, additional timing issues may occur due to variations in the duty cycle of the strobe signal.

Figure 4:
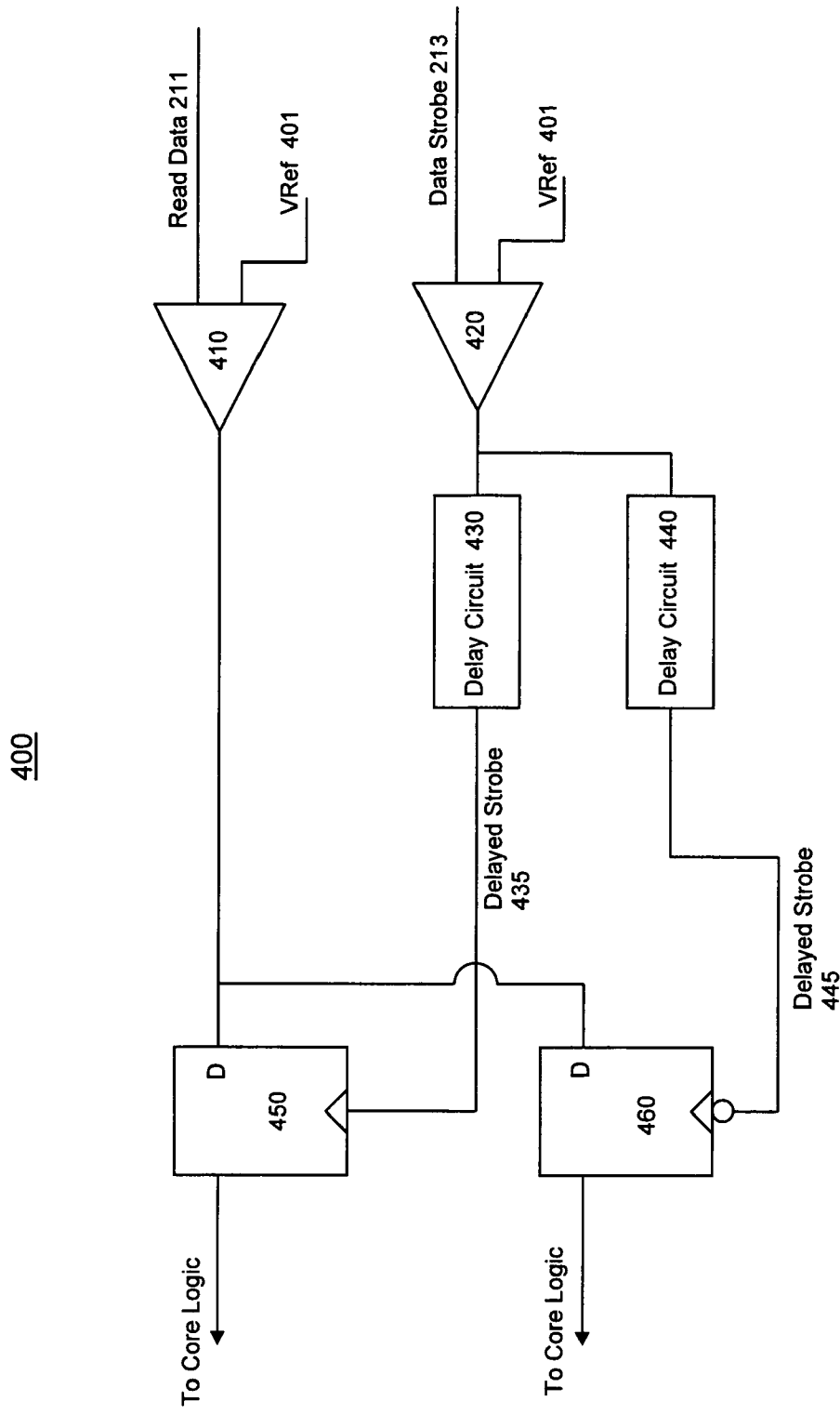
FIG. 4 is a schematic diagram of an example embodiment of an apparatus including a plurality of delay circuits capable of positioning rising and falling edges of a data strobe signal.

FIG. 4 is a schematic diagram of an example embodiment of circuit 400 including delay circuits 430 and 440 that are capable of positioning rising and falling edges, respectfully, of a data strobe signal in order to compensate for timing skew between a data strobe signal 213 and a read data line 211. The multiple delay circuits may also be used to compensate for variations in the duty cycle of data strobe 213. These are merely examples of how the multiple delay circuits may be used, and the scope of the claimed subject matter is not limited in this respect. The example embodiment of circuit 400 may be incorporated into a receiving device and/or unit coupled to a source synchronous data transfer interface, such as for one embodiment GPU 110.

Circuit 400 may further comprise a comparator 410 capable of receiving a read data signal 211 and a reference voltage signal 401. If the voltage level on read data 211 exceeds VRef 401, comparator 410 drives its output to a logically high voltage level. If the voltage level on read data 211 is less than VRef 401, comparator 410 drives its output to a logically low voltage level. The output of comparator 410 is coupled to an input of a flip-flop 450 and an input of a flip-flop 460.

Also included in example circuit 400 is a comparator 420 capable of receiving data strobe signal 213 and VRef 401. If the voltage level on data strobe 213 exceeds VRef 401, comparator 420 drives its output to a logically high voltage level. If the voltage level on data strobe 213 is less than VRef, comparator 420 drives its output to a logically low voltage level. The output of comparator 420 is coupled to inputs of delay circuits 430 and 440.

Delay circuits 430 and 440 may comprise any of a wide range of circuits for delaying an electrical signal. For one embodiment, one or both of delay circuits 430 and 440 may comprise delay locked loop (DLL) circuits, although the scope of the claimed subject matter is not limited in this respect. Delay circuit 430 may produce a delayed strobe signal 435, and delay circuit 440 may produce a delayed strobe signal 445. Delayed strobe 435 is coupled to a clock input of flip-flop 450 and delayed strobe 445 is coupled to a dock input of flip-flop 460. Flip-flop 450 for this example embodiment latches data at its input in response to rising edges of delayed strobe 435 and flip-flop 460 for this example embodiment latches data at its input in response to falling edges of delayed strobe 445. The outputs of flip-flops 450 and 460 may be coupled to other circuitry within a receiving device, for example a core logic unit, although the scope of the claimed subject matter is not limited in this respect. For one embodiment, the output of flip-flops 450 and 460 may be coupled to a first-in, first-out (FIFO) buffer, although, again, the scope of the claimed subject matter is not limited in this respect. The term "flip-flop" as used herein is meant to include any circuit capable of latching data at least in part in response to a an edge of a signal.

Although FIG. 4 depicts circuit 400 receiving a single data line 211, other embodiments are possible where a data strobe signal is associated with a plurality of data lines. For one embodiment, one data strobe signal may be associated with eight data lines. For another example embodiment, one data strobe signal may be associated with nine data lines. Of course, these are merely examples of the numbers of data lines that may be associated with a data strobe signal, and the scope of the claimed subject matter is not limited in these respects. For the example where one data strobe signal is associated with eight data lines, sixteen flip-flops may be used to latch read data. One delay circuit may provide a delayed strobe signal for eight of the flip-flops to latch data on rising edges of the delayed strobe signal, and another delay circuit may provide an additional delayed strobe signal for the other eight flip-flops to latch data on falling edges of the additional delayed strobe signal. Of course, this is merely one example of an embodiment comprising multiple data lines associated with a data strobe signal, and the scope of the claimed subject matter is not limited in these respects.

Although circuit 400 is described with a particular arrangement of circuitry, components, and/or units, other arrangements and/or configurations are possible. The scope of the claimed subject matter is not limited to the specific embodiment described in connection with example circuit 400.

Figure 5:
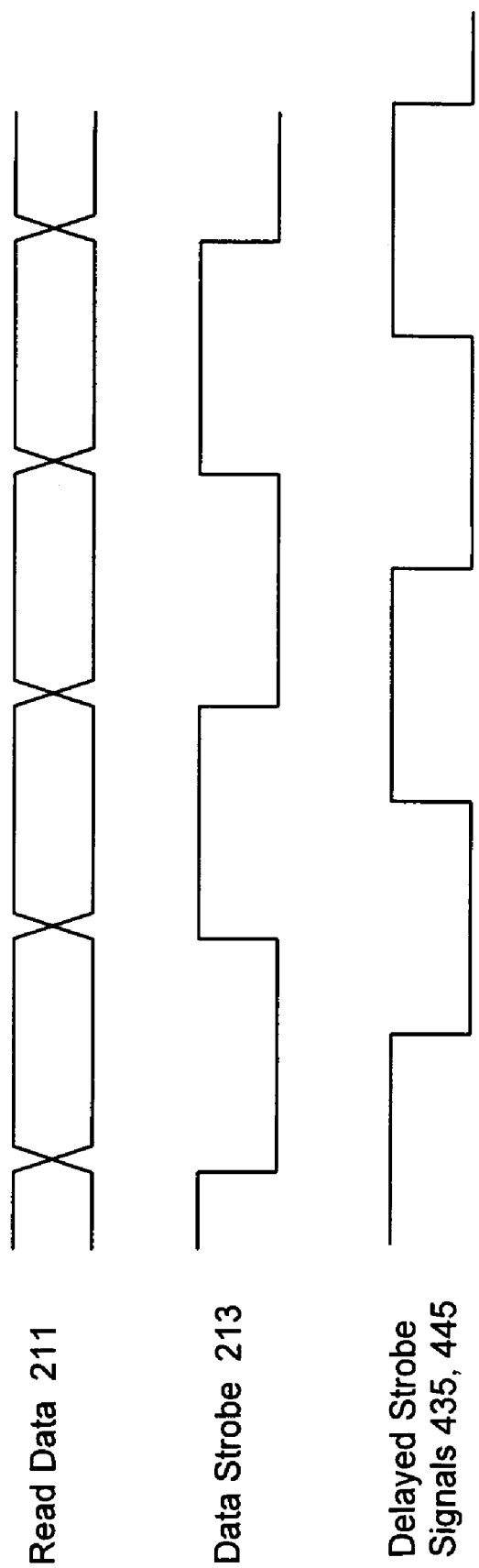
FIG. 5 is a timing diagram depicting example read data, data strobe, and delayed strobe signals.
Figure 6:
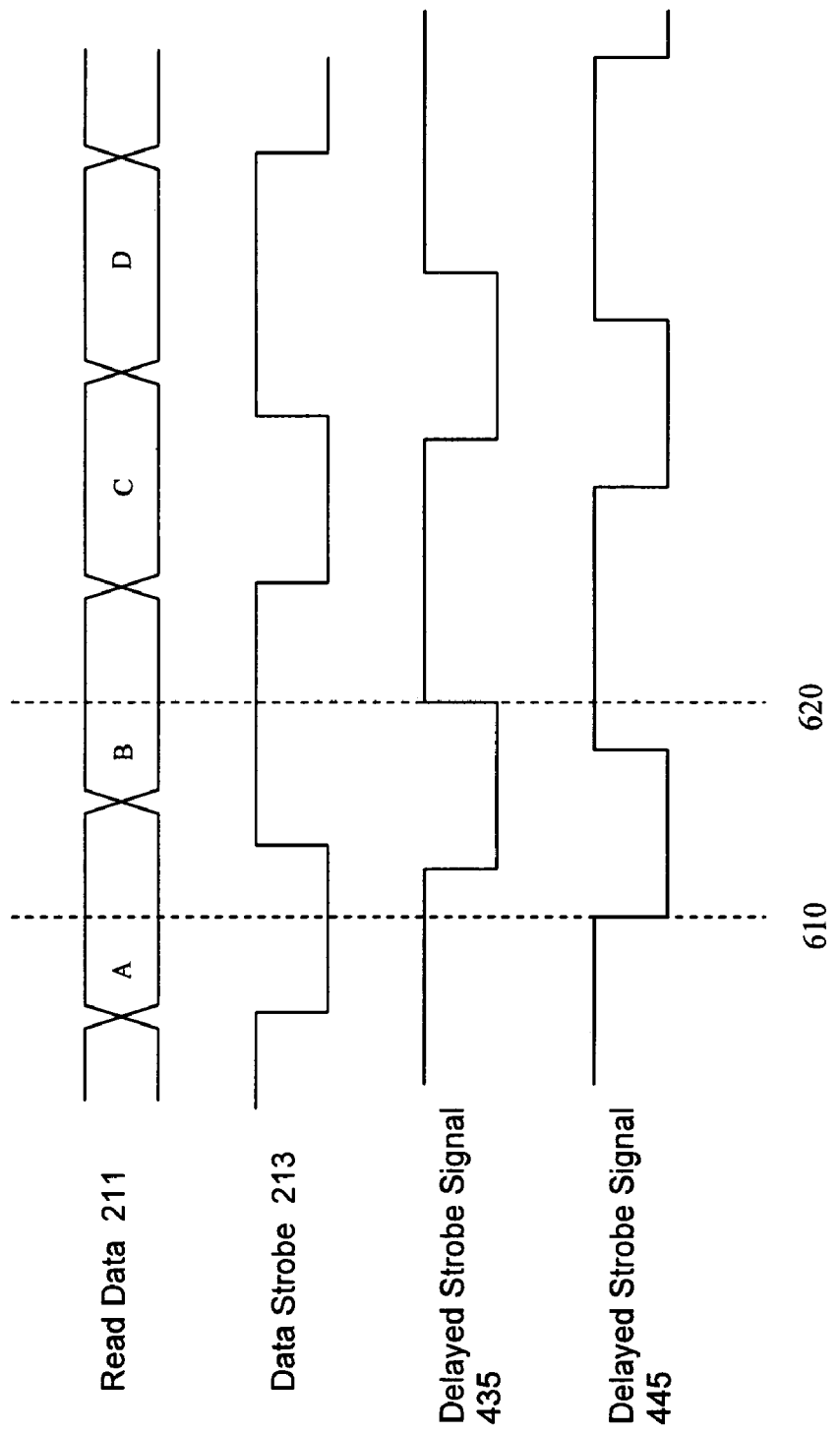
FIG. 6 is a timing diagram depicting example read data, data strobe, and delayed strobe signals where the data strobe signal has a duty cycle that varies from 50%.

The operation of example circuit 400 may be further understood by referring to FIGS. 5 and 6. FIG. 5 is a timing diagram depicting example timing relationships among read data signal 211, data strobe signal 213, and delayed strobe signals 435 and 445. For this example, data strobe 213 has a duty cycle of approximately 50%. As described above, read data 211 and data strobe 213 may be generated at a transmitting device, for example memory device 120. For this example, transitions on the read data and data strobe lines occur approximately simultaneously. Data strobe 213 may be received at comparator 420, and the output of comparator 420 is coupled to delay circuits 430 and 440.

For this example embodiment, delay circuits 430 and 440 may generate delayed strobe signals 435 and 445 that are delayed by approximately ¼ of a data strobe period, as can be seen in FIG. 5. Although delayed strobe signals 435 and 445 are depicted in FIG. 5 as having identical timings, delay circuits 430 and 440 may be capable of individually adjusting the timings for delayed strobe signals 435 and 445. Further, although the example embodiments described herein delay data strobe signal 213 by approximately ¼ of a strobe signal period, other embodiments may delay the data strobe signal by different amounts. By delaying data strobe signal 213 by approximately ¼ of a strobe cycle period, the rising and falling edges of the delayed strobe signals are positioned approximately in the middle of valid data periods of read data 211. As previously discussed, delay strobe signals 435 and 445 may be individually adjusted to compensate for timing skew issues and/or to individually position the rising and/or falling edges of delayed strobe signals 435 and 445 in a manner that provides approximately the optimal set-up and hold timings for read data 211. The adjustments to the delayed strobe signal timings may be as small as a few picoseconds, although the scope of the claimed subject matter is not limited in this respect. Further, the adjustments to the delayed strobe signal timings may be compensated for variations in the manufacturing process, temperature, and/or voltage.

Additionally, the timing adjustments provided by delay circuits 430 and 440 may be programmable. For one embodiment, a delay value may be written to a register indicating to a delay circuit how much to delay a strobe signal. Data transfer transactions may then be performed, and received data may be checked for errors. This process may be repeated for a number of delay values. A table may be made of delay values and corresponding data transaction test results. From the table values, an appropriate delay value may be selected. This is merely one example embodiment of a method for selecting and/or programming a delay value, and the scope of the claimed subject matter is not limited in this respect.

FIG. 6 is a timing diagram depicting example timing relationships among read data 211, data strobe 213, and delayed strobe signals 435 and 445 where data strobe signal 213 has a duty cycle that varies from 50%. For this example, for each period of data strobe signal 213, the data strobe signal is at a logically high voltage level for a longer period of time than it is at a logically low voltage level. By using a plurality of delay circuits, each of the rising and falling edges of the strobe signal can be positioned to be approximately at the middle of valid data regions of read data 211. For example, one delay value may be programmed into delay circuit 440 to position a falling edge of delayed strobe signal 445 at approximately the middle of data time A, and another delay value may be programmed into delay circuit 430 to position a rising edge of delayed strobe signal 435 at approximately the middle of data time B. In this manner, duty cycle irregularities for data strobe 213 may be compensated for. Of course, this is merely one example of compensating for duty cycle irregularities, and the scope of the claimed subject matter is not limited in these respects.

Figure 7:
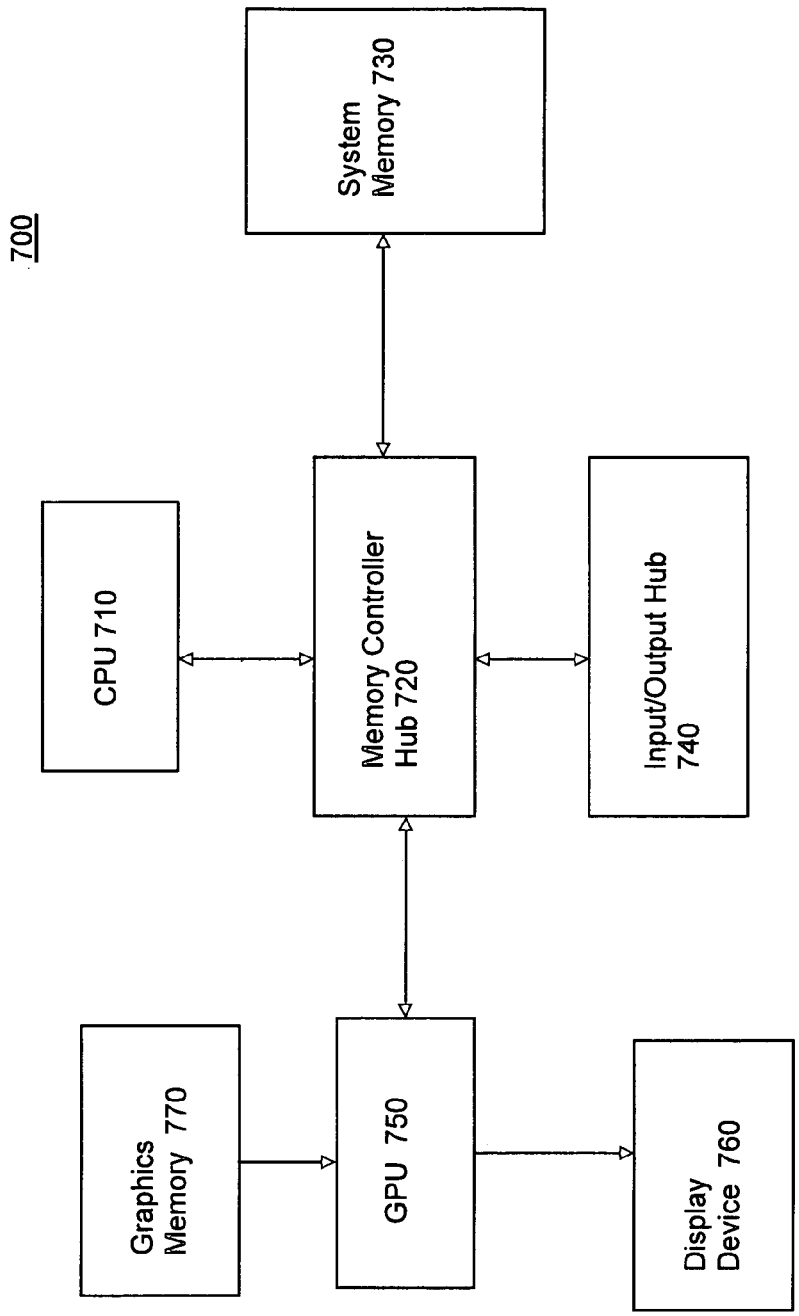
FIG. 7 is a block diagram of an example computing platform comprising a graphics processing unit coupled to a graphics memory.

FIG. 7 is a block diagram of an example embodiment of a computing platform 700. Computing platform 700 includes a CPU 710 and a memory controller hub 720 coupled to CPU 710. Memory controller hub 720 is further coupled to a system memory 730, to a GPU 750, and to an input/output hub 740. GPU 750 is further coupled to a display device 760, which may comprise a CRT display, a flat panel LCD display, or other type of display device. Also coupled to GPU 750 is a graphics memory 770. For this example embodiment, graphics memory 770 may be coupled to GPU 750 via a DDR interface. GPU 750 may comprise circuitry similar to that discussed above in connection with FIG. 4.

Although the example platform 700 is described with a source synchronous interface between graphics memory 770 and GPU 750, other embodiments may include source synchronous interfaces between other components within the platform. Also, the multiple delay circuit embodiments described above for example in connection with FIG. 4 may be included in any of a wide range of computing platform components and/or devices. That is, any of the components of computing platform 700 may comprise transmitting devices and/or receiving devices configured in accordance with the example transmitting and receiving device embodiments described herein. Further, although the data transfer interfaces described herein are used to couple various components in a computing platform, other embodiments may include data transfer interfaces used for intra-chip data transfers, and still other embodiments are possible that may include data transfers between different integrated circuit dice that may share a package.

Although example system 700 is shown with a particular configuration of components, other embodiments possible using any of a wide range of configurations. Further, the example embodiments described herein may be utilized in any of a wide range of electronic devices, including, but not limited to, computing platforms, gaming devices, cellular phones, personal digital assistants, music players, communications network components, etc.

Figure 8:
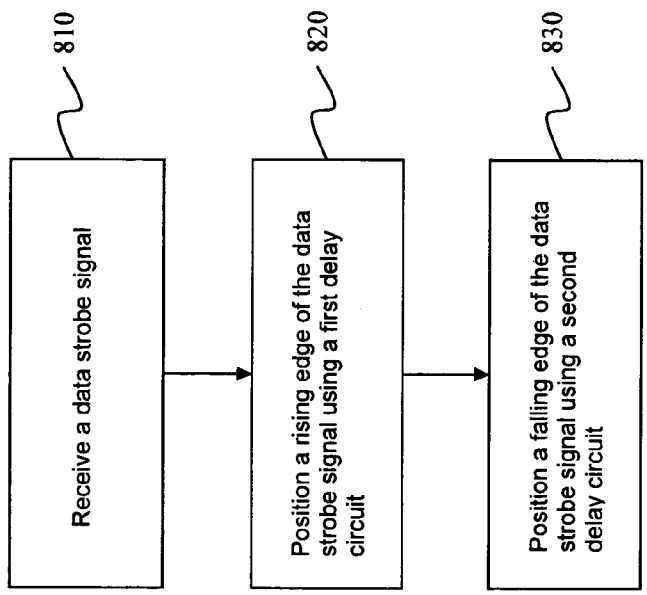
FIG. 8 is a flow diagram of an example embodiment of a method for positioning rising and falling edges of a strobe signal.

FIG. 8 is a flow diagram of an example embodiment of a method for positioning rising and falling edges of a strobe signal. At block 810, a data strobe signal may be received. At block 820, a rising edge of the data strobe signal may be positioned using a first delay circuit. At block 830, a falling edge of the data strobe signal may be positioned using a second delay circuit. This example method may comprise embodiments described above in connection with FIGS. 1-7, although the scope of the claimed subject matter is not limited in this respect. An embodiment in accordance with claimed subject matter may include all, more than all or less than all of blocks 810-830. Furthermore, the order of blocks 810-830 is merely one example order, and the scope of the claimed subject matter is not limited in this respect.

Figure 9:
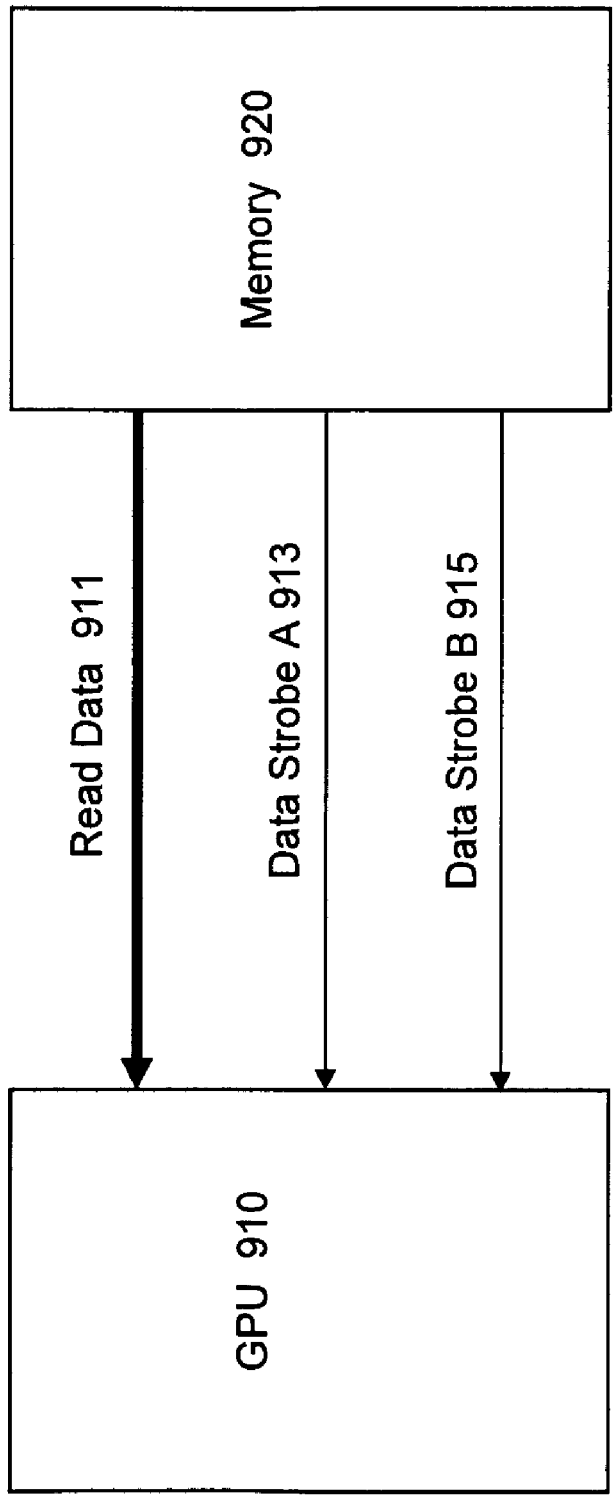
FIG. 9 is a block diagram of an example embodiment of a graphics processing unit adapted to receive read data and one or more data strobe signals from a memory device.

FIG. 9 is a block diagram of an example embodiment of a graphics processing unit 910 adapted to receive read data 911, a data strobe A signal 913, and a data strobe B signal 915 from a memory device 920. For this example embodiment, read data 911 may be transferred over a plurality of parallel data lines, although the scope of the claimed subject matter is not limited in this respect. Also for this example embodiment, read data 911 may be transferred in a source-synchronous mode, although again the scope of the claimed subject matter is not limited in this respect. For this example embodiment, GPU 910 may latch data present on the data lines 911 in response to transitions of data strobe signals 913 and 915. Data strobe signals 913 and 915 may be generated by memory device 920 for this example embodiment. GPU 910 is merely an example of a receiving device, component, and/or unit, and the scope of the claimed subject matter is not limited in this respect. Also, memory device 920 is merely an example of a transmitting device, component, and/or unit, and the scope of the claimed subject matter is not limited in this respect. Although two data strobe lines are depicted in FIG. 9 and are discussed herein in connection with various embodiments, other embodiments are possible using a single data strobe signal. Further, although this example embodiment may comprise a source-synchronous interconnect comprising read data lines 911 and one or more data strobes, other embodiments are possible that are not source-synchronous. For example, embodiments are possible where a data strobe signal may comprise a free-running clock signal. Also, data strobe signals 913 and/or 915 may comprise single-ended signals for some embodiments. For other embodiments, data strobe signals 913 and/or 915 may comprise differential signals where each data strobe may comprise a data strobe signal and its complement. That is, each data strobe signal for one or more embodiments may comprise a first signal and a second signal transmitted together where the second signal may be 180 degrees out of phase with the first signal.

Figure 10:
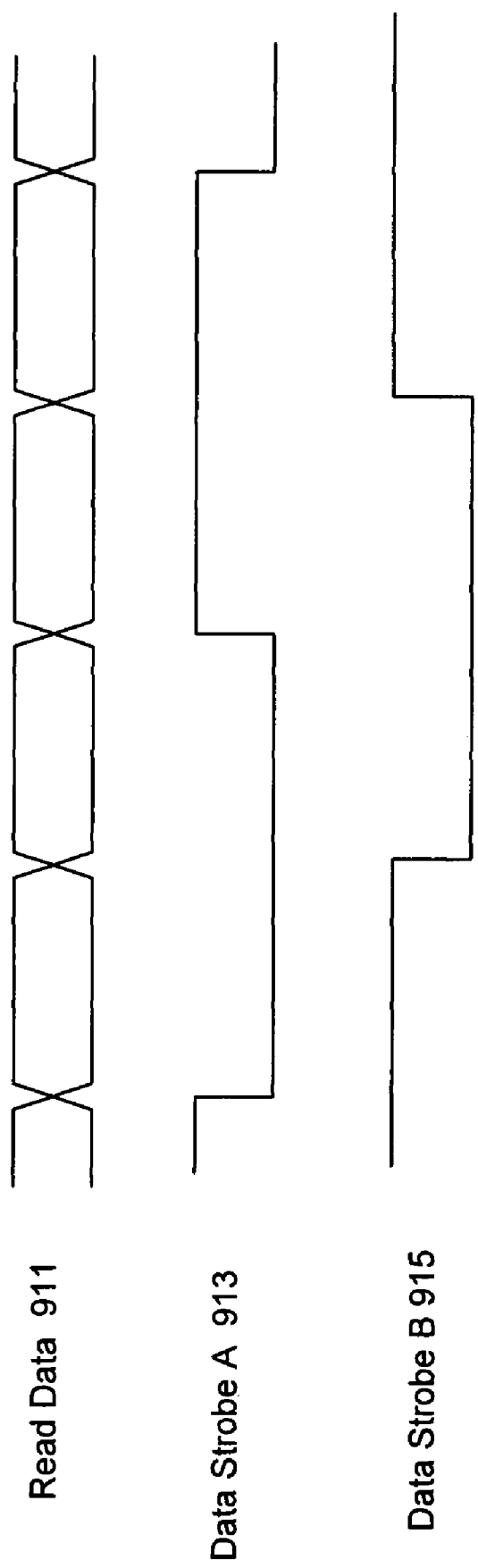
FIG. 10 is a timing diagram depicting an example read data signal and example data strobe signals.

FIG. 10 is a timing diagram depicting example timing relationships for read data 911 and data strobe signals 913 and 915 as transmitted by memory device 920. For this example embodiment, for each cycle of a data strobe signal (data strobe A 913 and/or data strobe B 915), four data cycles may occur. Also for this embodiment, data strobe B 915 may be shifted 90 degrees out of phase with respect to data strobe A 913. That is, data strobe B 915 is shifted by approximately one bit-time in relation to data strobe A 913. However, the timing relationships depicted in FIG. 10 are merely example relationships, and the scope of the claimed subject matter is not limited in these respects.

Figure 11:
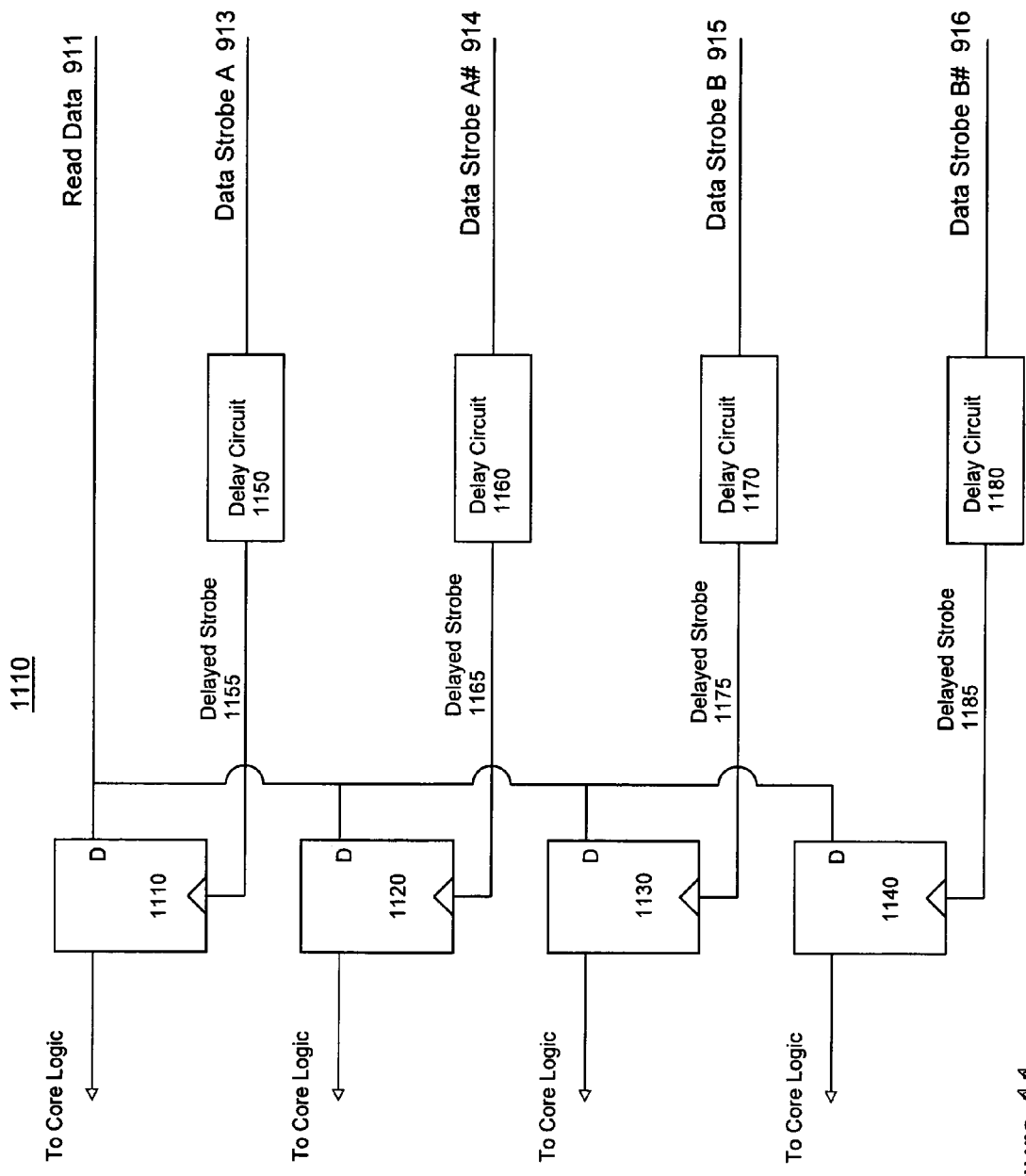
FIG. 11 is a schematic diagram of an example embodiment of an apparatus including a plurality of delay circuits capable of positioning edges of one or more data strobe signals.

FIG. 11 is a schematic diagram of an example embodiment of a circuit 1100 comprising a plurality of delay circuits capable of positioning edges of one or more data strobe signals. For this embodiment, circuit 1100 may be implemented in GPU 910, although the scope of the claimed subject matter is not limited in this respect. For this example embodiment, memory device 920 may deliver read data 911 to GPU 910, and may also deliver data strobe A 913 and data strobe B 915. Also for this embodiment, the data strobe signals 913 and 915 may comprise differential signals and therefore complements of data strobe A 913 and data strobe B 915 are provided to GPU 910. The complements of data strobe A 913 and data strobe B 915 are labeled data strobe A#914 and data strobe B#916, respectively. Read data line 911 may be coupled to flip-flops 1110, 1120, 1130, and 1140. Although for this example a single data line is depicted and is described as being associated with the plurality of data strobe signals, other embodiments are possible where any of a wide range of numbers of data lines may be associated with one or more data strobe signals.

For this example embodiment, data strobe A 913 may be coupled to a delay circuit 1150 and data strobe A#914 may be coupled to delay circuit 1160. Data strobe B 915 may be coupled to a delay circuit 1170 and data strobe B#916 may be coupled to delay circuit 1180. Delay circuit 1150 may generate delayed strobe signal 1155. Delayed strobe signal 1155 may be derived from data strobe A 913 and may be coupled to a clock input of flip-flop 1110. For this example embodiment, flip-flop 1110 may latch data from read data line 911 in response to detecting a rising edge of delayed strobe signal 1155. Also, delay circuit 1160 may generate delayed strobe signal 1165. Delayed strobe signal 1165 may be derived from data strobe A#914 and may be coupled to a clock input of flip-flop 1120. Flip-flop 1110 may latch data from read data line 911 in response to detecting a rising edge of delayed strobe signal 1165. Further, delay circuit 1170 may generate delayed strobe signal 1175. Delayed strobe signal 1175 may be derived from data strobe B 915 and may be coupled to a clock input of flip-flop 1130. For this example embodiment, flip-flop 1130 may latch data from read data line 911 in response to detecting a rising edge of delayed strobe signal 1175. Similarly, delay circuit 1180 may generate delayed strobe signal 1185. Delayed strobe signal 1185 may be derived from data strobe B#916 and may be coupled to a clock input of flip-flop 1140. Flip-flop 1140 may latch data from read data line 911 in response to detecting a rising edge of delayed strobe signal 1185.

For this example embodiment, delay circuits 1150-1180 may generate delayed strobe signals 1155-1185 that are delayed by approximately one-half of a bit-time in relation to data strobe signals 913-916, as may be understood more clearly by referring to FIG. 12 and the associated discussion below. Although the example embodiments described herein delay data strobe signals 913-916 by approximately one half of a bit-time, other embodiments may delay the data strobe signals by different amounts. By delaying data strobe signals 913-916 by approximately one half of a bit-time, the rising edges of delayed strobe signals 1155-1185 are positioned approximately in the middle of valid data periods of read data 911.

Also for this example embodiment, delayed strobe signals 1155-1185 may be offset from each other by a programmable amount. For one embodiment, as may be understood more fully be referring to FIG. 12 and the associated discussion below, delayed strobe signals may be shifted by approximately one bit-time in relation to another delayed strobe signal. For example, delayed strobe signal 1175 may be shifted by approximately one bit-time in relation to delayed strobe signal 1155. In this manner, rising edges of the various delayed strobe signals may occur during valid data periods for a sequence of four data cycles of read data 911.

As previously discussed, delayed strobe signals 1155-1185 may be individually adjusted to compensate for timing skew issues and/or to individually position the rising and/or falling edges of delayed strobe signals 1155-1185 in a manner that may provide approximately optimal set-up and hold timings for read data 911. The adjustments to the delayed strobe signal timings may be as small as a few picoseconds, although the scope of the claimed subject matter is not limited in this respect. Further, the adjustments to the delayed strobe signal timings may be compensated for variations in the manufacturing process, temperature, and/or voltage.

Additionally, the timing adjustments provided by delay circuits 1150-1180 may be programmable. For one embodiment, a delay value may be written to a register indicating to a delay circuit how much to delay a strobe signal. Data transfer transactions may be performed, and received data may be checked for errors. This process may be repeated for a number of delay values. A table may be made of delay values and corresponding data transaction test results. From the table values, an appropriate delay value may be selected. However, this is merely one example embodiment of a method for selecting and/or programming a delay value, and the scope of the claimed subject Matter is not limited in this respect.

Delay circuits 1150-1180 may comprise any of a wide range of circuits for delaying an electrical signal. For one embodiment, delay circuits 1150-1180 may comprise delay locked loop (DLL) circuits, although the scope of the claimed subject matter is not limited in this respect.

Although the embodiments described herein make use of multiple delay circuits for multiple data strobe signals within a receiving device such as a GPU, other embodiments are possible where the delay circuits capable of adjusting the timing for multiple data strobe signals are located within a transmitting device. For example, a GPU may comprise circuitry including a plurality of data strobe delay circuits capable of adjusting the timing of a plurality of delayed data strobe signals that may be provided to a receiving device.

Figure 12:
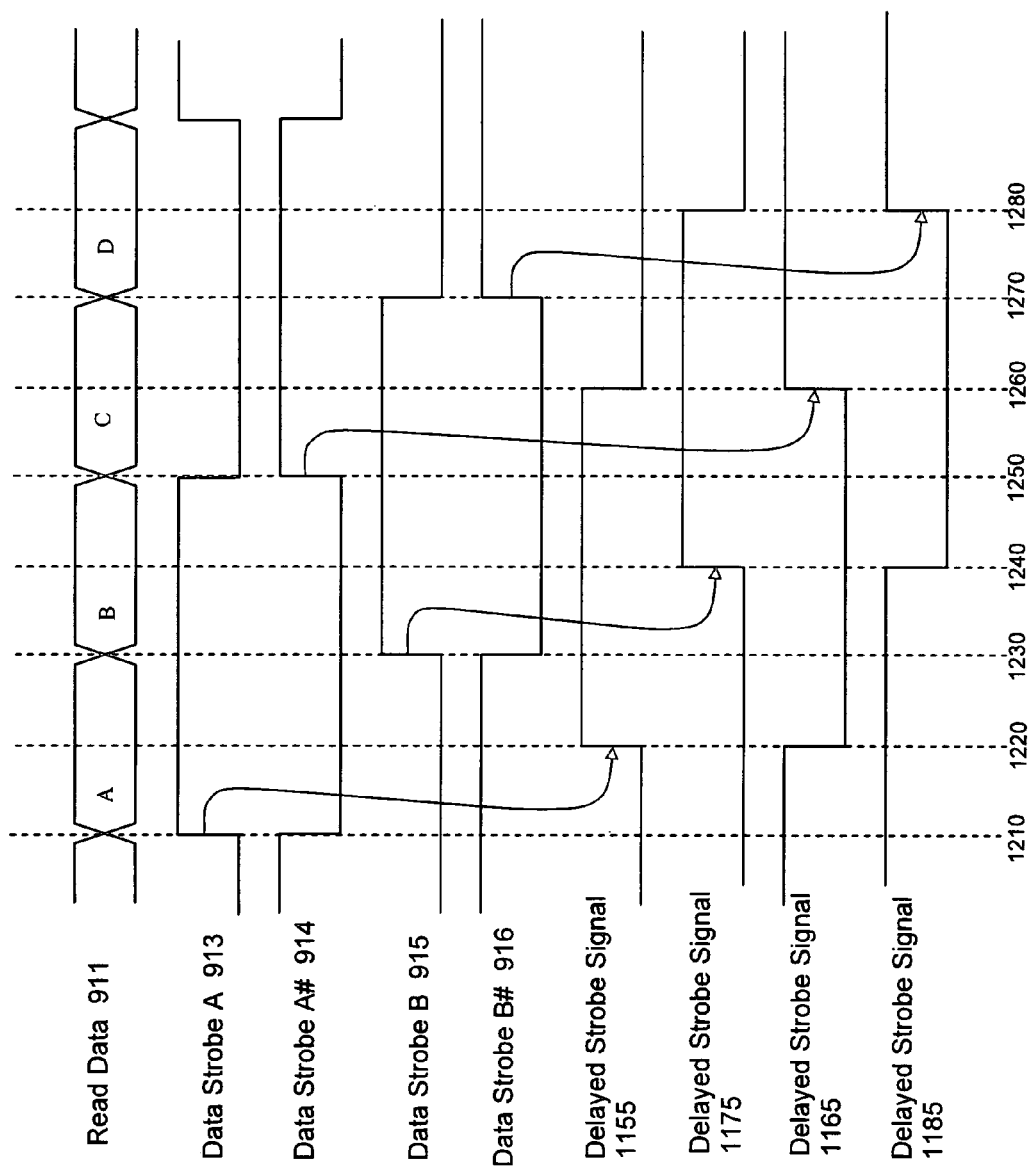
FIG. 12 is a timing diagram depicting example read data, data strobe, and delayed strobe signals.

FIG. 12 is a timing diagram depicting example timing relationships among read data signal 911, data strobe signals 913-916, and delayed strobe signals 1155-1185. The timing relationships depicted in FIG. 12 are merely example relationships, and the scope of the claimed subject matter is not limited in these respects. For this example, read data 911 may comprise a sequence of four data cycles, labeled A, B, C, and D. Data cycle A may begin approximately at time 1210. Data cycle B may begin approximately at time 1230, and data cycle C may commence at approximately time 1250. Data cycle D may begin at approximately time 1270. Each of the data cycles may have a duration of approximately one bit-time.

For this example embodiment, memory device 920 may provide two differential pairs of data strobe signals: data strobe A 913, data strobe A# 914, data strobe B 915, and data strobe B#916. For other embodiments, a transmitting device may provide fewer data strobe signals. For example, a transmitting device may provide a single data strobe or free-running clock. The single data strobe or free-running clock may comprise a differential pair of signals or may comprise a single-ended signal. Data strobe generation logic in the receiving device may be capable of deriving multiple data strobes from the one or more data strobes or free-running clock signals provided by the transmitting device. These are merely examples of how data strobes may be provided and/or derived, and the scope of the claimed subject matter is not limited in these respects.

For this example, at time 1210, a rising edge occurs on data strobe A 913. Delay circuit 1150 may delay strobe 913 to produce delayed strobe signal 1155. As may be seen in FIG. 12, a rising edge occurs on delayed strobe signal 1155 at time 1220, which is approximately one-half of a bit-time after time 1210. Delayed strobe signal 1155 may cause flip-flop 1110 to latch data from read data signal 911 approximately in the middle of data cycle A. As previously mentioned, the timing of delayed strobe 1155 may be adjusted in order to position the rising edges such that approximately optimal set-up and hold times may be achieved.

Also for this example, at time 1230, a rising edge occurs on data strobe B 915. Delay circuit 1170 may delay strobe 915 to produce delayed strobe signal 1175. As may be seen in FIG. 12, a rising edge occurs on delayed strobe signal 1175 at time 1240, which is approximately one-half of a bit-time after time 1230. Delayed strobe signal 1175 may cause flip-flop 1130 to latch data from read data signal 911 approximately in the middle of data cycle B. The timing of delayed strobe 1175 may be adjusted in order to position the rising edges such that approximately optimal set-up and hold times may be achieved. Further, for this embodiment, the rising edge of delayed strobe signal 1175 may occur approximately one bit-time after the rising edge of delayed strobe signal 1155. That is, delayed strobe signal 1175 is shifted by approximately one bit-time in relation to delayed strobe signal 1155. In other words, delayed strobe signal 1175 may be approximately 90 degrees out of phase with delayed data strobe 1155.

Further, for this example, at time 1250, a rising edge occurs on data strobe A#914. Delay circuit 1160 may delay strobe 914 to produce delayed strobe signal 1165. As may be seen in FIG. 12, a rising edge occurs on delayed strobe signal 1165 at time 1260, which is approximately one-half of a bit-time after time 1250. Delayed strobe signal 1165 may cause flip-flop 1120 to latch data from read data signal 911 approximately in the middle of data cycle C. The timing of delayed strobe 1165 may be adjusted in order to position the rising edges such that approximately optimal set-up and hold times may be achieved. Further, for this embodiment, the rising edge of delayed strobe signal 1165 may occur approximately one bit-time after the rising edge of delayed strobe signal 1175. That is, delayed strobe signal 1165 is shifted by approximately one bit-time in relation to delayed strobe signal 1175.

Additionally, for this example, at time 1270, a rising edge occurs on data strobe B#916. Delay circuit 1180 may delay strobe 916 to produce delayed strobe signal 1185. A rising edge occurs on delayed strobe signal 1185 at time 1280, which is approximately one-half of a bit-time after time 1270. Delayed strobe signal 1185 may cause flip-flop 1140 to latch data from read data signal 911 approximately in the middle of data cycle D. The timing of delayed strobe 1185 may be adjusted in order to position the rising edges such that approximately optimal set-up and hold times may be achieved. Further, for this embodiment, the rising edge of delayed strobe signal 1185 may occur approximately one bit-time after the rising edge of delayed strobe signal 1165. That is, delayed strobe signal 1185 is shifted by approximately one bit-time in relation to delayed strobe signal 1165.

Figure 13:
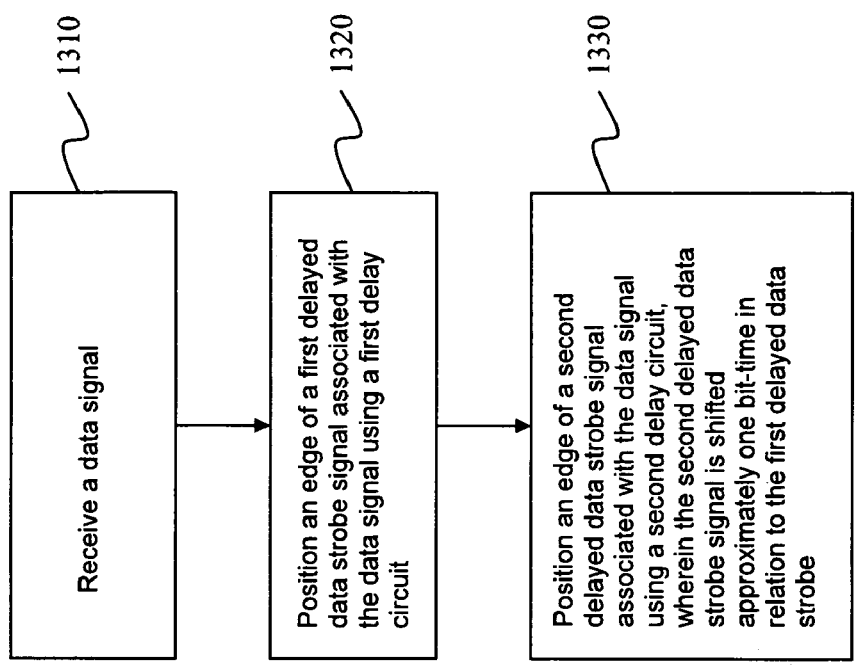
FIG. 13 is a flow diagram of an example embodiment of a method for positioning edges of a plurality of data strobe signals.

FIG. 13 is a flow diagram of an example embodiment of a method for positioning edges of a plurality of data strobe signals. At block 1310, a data signal is received. At block 1320, an edge of a first delayed data strobe signal is positioned using a first delay circuit. The first delayed strobe signal for this embodiment is associated with the data signal. At block 1330, an edge of a second delayed data strobe signal associated with the data signal is positioned using a second delay circuit, wherein the second delayed data strobe signal is shifted approximately one bit-time in relation to the first delayed data strobe. An embodiment in accordance with claimed subject matter may include all, more than all or less than all of blocks 1310-1330. Furthermore, the order of blocks 1310-1340 is merely one example order, and the scope of the claimed subject matter is not limited in this respect.

In the preceding description, various aspects of claimed subject matter have been described. For purposes of explanation, systems and configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter.

While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. An apparatus, comprising:
   a first register to store a first delay value and a second register to store a second delay value;
   a first programmable delay circuit to position an edge of a first delayed data strobe signal corresponding to a first data strobe signal to substantially the middle of a valid data period of a data signal based at least in part on said first delay value, the first delayed data strobe signal to indicate latch timing for said data signal, wherein said valid data period excludes a falling edge and a rising edge of said data signal;
   a second programmable delay circuit to position an edge of a second delayed data strobe signal corresponding to a second data strobe signal to substantially the middle of said valid data period of said data signal based at least in part on said second delay value, the second delayed data strobe signal to further indicate latch timing for the data signal;
   a third delay circuit to position an edge of a third delayed data strobe signal corresponding to a complement of the first data strobe signal; and
   a fourth delay circuit to position an edge of a fourth delayed data strobe signal corresponding to a complement of the second data strobe signal.

2. The apparatus of claim 1, wherein the third delayed data strobe signal is shifted in operation by approximately two bit times in relation to the first delayed data strobe signal and further wherein the fourth delayed data strobe signal is shifted in operation by approximately three bit times in relation to the first delayed data strobe signal.

3. The apparatus of claim 1, further comprising:
   a first flip-flop to latch data from the data signal in response to an edge of the first delayed data strobe signal; and
   a second flip-flop to latch data from the data signal in response to an edge of the second delayed data strobe signal.

4. The apparatus of claim 3, wherein the edge of the first delayed data strobe signal comprises a rising edge and further wherein the edge of the second delayed data strobe signal comprises a rising edge.

5. The apparatus of claim 3, further comprising an input buffer to receive the data signal and further to deliver data to the first and second flip-flops.

6. The apparatus of claim 1, wherein the apparatus comprises a graphics processing unit.

7. An apparatus, comprising:
   a first register to store a first delay value and a second register to store a second delay value;
   a first programmable delay circuit to position an edge of a first delayed data strobe signal corresponding to a first data strobe signal to substantially the middle of a valid data period of a data signal based at least in part on said first delay value, the first delayed data strobe signal to indicate latch timing for said data signal, wherein said valid data period excludes a falling edge and a rising edge of said data signal;
   a second programmable delay circuit to position an edge of a second delayed data strobe signal corresponding to a second data strobe signal to substantially the middle of said valid data period of said data signal based at least in part on said second delay value, the second delayed data strobe signal to further indicate latch timing for the data signal;
   a first data strobe input circuit to receive the first data strobe signal and further to transmit the first data strobe signal to the first programmable delay circuit; and
   a second data strobe input circuit to receive the second data strobe signal and further to transmit the second data strobe signal to the second programmable delay circuit.

8. A system, comprising:
   a transmitting device to transmit a data signal and first and second data strobe signals; and
   a receiving device to receive the data signal and the first and second data strobe signals, the receiving device comprising
   a first register to store a first delay value and a second register to store a second delay value;
   a first programmable delay circuit to position an edge of a first delayed data strobe signal corresponding to the first data strobe signal to substantially the middle of a valid data period of a data signal based at least in part on said first delay value, the first delayed data strobe signal to indicate latch timing for the data signal, wherein said valid data period excludes a falling edge and a rising edge of said data signal; and
   a second programmable delay circuit to position an edge of a second delayed data strobe signal corresponding to the second data strobe signal to substantially the middle of said valid data period of said data signal based at least in part on said second delay value, the second delayed data strobe signal to further indicate latch timing for the data signal, wherein the first data strobe signal comprises a first differential pair of signals and further wherein the second data strobe signal comprises a second differential pair of signals.

9. The system of claim 8, wherein the receiving device further comprises a first flip-flop to latch data from the data signal in response to an edge of the first delayed data strobe signal, and a second flip-flop to latch data from the data signal in response to an edge of the second delayed data strobe signal.

10. The system of claim 9, wherein the edge of the first delayed data strobe signal comprises a rising edge and further wherein the edge of the second delayed data strobe signal comprises a rising edge.

11. The system of claim 8, wherein the second data strobe signal comprises a data strobe signal shifted in operation approximately one bit time in relation to the first data strobe signal.

12. The system of claim 8, wherein the transmitting device comprises a memory device.

13. The system of claim 8, wherein the receiving device comprises a graphics processing unit.

14. A method, comprising:

storing a value of first programmable amount of delay and a value of second programmable amount of delay;

receiving a data signal;

positioning an edge of a first delayed data strobe signal associated with a first data strobe signal by a first programmable amount to substantially the middle of a valid data period of a data signal based at least in part on said first programmable amount of delay, the first delayed data strobe signal to indicate latch timing for the data signal, wherein said valid data period excludes a falling edge and a rising edge of said data signal; and positioning an edge of a second delayed data strobe signal associated with a second data strobe signal by a second programmable amount to substantially the middle of said valid data period of said data signal based at least in part on said second programmable amount of delay, the second delayed data strobe signal to further indicate latch timing for the data signal, wherein the first data strobe signal comprises a first differential pair of signals and further wherein the second data strobe signal comprises a second differential pair of signals.

15. The method of claim 14, further comprising latching data from the data signal in response to the edge of the first delayed data strobe signal and further comprising latching data from the data signal in response to the edge of the second delayed data strobe signal.

16. The method of claim 15, wherein the second data strobe signal is shifted in operation by approximately one bit time in relation to the first data strobe signal.

17. The method of claim 16, wherein said latching data from the data signal in response to the edge of the first delayed strobe signal comprises latching data from the data signal in response to a rising edge of the first delayed strobe signal and further wherein said latching data from the data signal in response to the edge of the second delayed strobe signal comprises latching data from the data signal in response to a rising edge of the second delayed strobe signal.

* * * * *